United States Patent [19]

Dubin

[11] Patent Number: 5,574,380

[45] Date of Patent: Nov. 12, 1996

[54] CURRENT MEASUREMENT CIRCUIT COMPRISING A MUTUALLY COUPLED TRANSFORMER AND AN INTEGRATION CIRCUIT

[75] Inventor: Michel Dubin, Poitiers, France

[73] Assignee: Schlumberger Industries, S.A., Montrouge, France

[21] Appl. No.: 444,499

[22] Filed: May 19, 1995

[30] Foreign Application Priority Data

Jun. 1, 1994 [FR] France .................................. 94 06675

[51] Int. Cl.⁶ .................................................. G01R 27/26
[52] U.S. Cl. ........................................... 324/654; 324/142
[58] Field of Search ..................... 324/654–657, 324/649, 629, 207.18, 207.29, 652, 117 R, 127; 318/657; 455/333

[56] References Cited

U.S. PATENT DOCUMENTS

| | | | |
|---|---|---|---|
| 4,255,707 | 3/1981 | Miller | 324/142 |
| 4,467,320 | 8/1984 | McPhee | 318/657 |
| 5,180,979 | 1/1993 | Frazzini et al. | 324/207.18 |
| 5,265,267 | 11/1993 | Martin et al. | 455/333 |

FOREIGN PATENT DOCUMENTS

| | | |
|---|---|---|
| 0181719 | 5/1986 | European Pat. Off. . |
| 0403330 | 12/1990 | European Pat. Off. . |
| 2242798 | 9/1991 | United Kingdom . |

OTHER PUBLICATIONS

Patent Abstracts of Japan, vol. 18, No. 420 (P–1782), Aug. 5, 1994 & JP–A–06 130 098 (Mitsubishi Electric) May 13, 1994.

*Primary Examiner*—Michael Tokar
*Attorney, Agent, or Firm*—Leonard W. Pojunas

[57] ABSTRACT

A current measurement circuit comprising a mutual inductance transformer 3, an integration circuit 2, and a dither circuit 1 which adds a square wave to the signal from the transformer 3 before the input of the integration circuit 2 in order that the integration circuit 2 provides a signal representing the measured current perturbed by a triangular dither signal.

7 Claims, 2 Drawing Sheets

CURRENT MEASUREMENT CIRCUIT COMPRISING A MUTUALLY COUPLED TRANSFORMER AND AN INTEGRATION CIRCUIT

The present invention concerns a current measurement circuit comprising a mutually coupled transformer and an integration circuit which integrates the signal of the mutually coupled transformer.

The use of mutually coupled transformers (otherwise known as inductively coupled transformers) for measuring currents possesses certain advantages in comparison with other measuring devices. In particuler, in the field of electricity metering, the use of a mutually coupled transformer avoids the problems of saturation by dc currents which arise with iron-core transformers and enables the measurement of the current separately from other measurements, for example measurements of the current on the other phases of a multiphase network. However, mutually coupled transformers present a particular problem in that the signal supplied by the transformer is the derivative of the measured current. Thus, the use of a mutually coupled transformer requires an integration circuit to process the signal.

A measurement circuit including a mutually coupled transformer and an integration circuit are described in the patent application EP 0 403 330. The integration circuit of this application is particularly adapted to suppress low frequency signals and parasitic dc signals which can be produced at the output of conventional integration circuits.

It is often the case that signals representing a measurement of current are converted by an analogue digital converter for later processing. A known technique for improving the resolution of an analogue digital converter uses a dither signal added to the measured signal before conversion by the converter. This dither signal can be a random signal or a periodic signal, for example a triangular signal or a signal having the form of a ramp. Using this technique the value of the measured signal can be determined by an analysis of the converted values of the signal with a resolution finer than that normally possible with the available quantisation steps of the converter. The principals of the dither technique have been known for a long time and examples of measurement and communication systems which use a dither signal for improving the performance of a converter are described in U.S. Pat. No. 4,187,466, EP 0 181 719 and EP 0 613 256. The patent EP 0 181 719 in particular describes the principles of a system which adds a triangular dither signal to the current signal before conversion.

It is thus desirable to have a system for measuring currents which combines the advantages associated with a mutually coupled transformer with those associated with the use of a dither signal. The generation of a dither signal can present problems in relation to the cost of components and the complexity of the system which generates it. The present invention aims to provide a system which provides the advantages of the two techniques but which avoids the problems of complexity and duplication of components.

To this end, the present invention is characterized in that the measurement circuit further comprises a dither circuit which adds a substantially rectangular signal to the signal from the transformer before the input of the integration circuit in order that the integration circuit provides a signal representing the measured current perturbed by a substantially triangular dither signal.

In general, a square wave or rectangular signal is not appropriate as a dither signal but it may be easily generated in an electronic circuit, for example; at the output of a microprocessor. The present invention provides a circuit in which a current signal modulated by a triangular dither signal is produced and which can be sent to an analogue to digital converter, but which avoids duplication of components due to the fact that the integration circuit performs both the functions of integration of the signal from the mutually coupled transformer and of creation of a dither signal.

As described above, the value of the measured signal by the transformer may then be calculated after conversion by the steps of signal processing with a resolution finer than that possible with only an analogue to digital converter.

The integration circuit may be a digital or analogue integrator of a conventional type. However, preferably, a circuit similar to that of EP 0 403 330 is used, which comprises an amplifier having an associated gain resistance and a feedback loop, the feedback loop comprising a feedback capacitor, the integration circuit further comprising a second integrator mounted at the output of the amplifier, upstream of the feedback loop.

By these means, the integration circuit suppresses low frequencies and parasite dc signals which can arise in conventional analogue circuits. Preferably, the integration ciricuit can further comprise means for correction of the phase delays in the integratd signal, in particular the delay introduced by the gain resistance of the integrator, comprising a passive filter mounted upstream of the amplifier. Where the current measurent circuit forms part of the input circuit of an electricity meter, including a voltage measurement circuit, the passive filter can be dimensioned in order that all the phase delays between the voltage and current paths are corrected by this filter, the voltage in the network being measured directly without changing its phase. Thus, the voltage channel is free from constraints regarding the use of components used for correction of phase, which is advantageous if the voltage channel is also used for communication of data.

As discussed above, a square wave or rectangular signal is easily generated by an electronic circuit. In one embodiment, the rectangular signal can be generated using a pulse width modulated signal (PWM), provided at an output of a microprocessor, which signal is passed via a switching means comprising at least one latch in order to divide the average frequency of the PWM signal and to create the square wave.

The use of a dither signal having the form of a simple triangular waveform can cause problems associated with the relation between the amplitude of the signal and the quantisation steps of the converter. In particular, a problem arises if the amplitude of the dither signal is not equal to an integral number of quantisation steps of the converter. In order to overcome these problems, the dither circuit preferably supplies a rectangular signal which is further modulated by a modulation signal. This signal is then integrated in order to become a modulated triangular signal.

The use of a signal having this form overcomes the problems associated with the differences between the amplitude of the non-modulated triangular signal and the quantisation levels of the converter. In effect, the modulation signal introduces a component to the converted values which is dependant on the differences between the amplitude of the triangular signal and the quantisation steps of the converter and which can be suppressed after conversion in the same processing operation that suppresses the dither signal, for example, by using a decimation filter.

Preferably, the modulation signal is also generated using the PWM signal of the microprocessor. In one embodiment, the two limits of the modulation signal may be generated using two integrating circuits which integrate the PWM signal (and its inverse) in order to create each limit. However, it is possible to further reduce the number of components used. Preferably, the dither circuit comprises an integrator which integrates the pulse width modulated signal in order to create a triangular signal representing one limit of the modulation signal, this signal being supplied to switching means in order to create a substantially rectangular signal having only one limit which varies as per the signal from the integrator, the dither circuit further comprising a filter which filters low frequency components from the signal so as to provide a rectangular signal which is symetrically modulated.

Considering the rectangular modulated signal before the filtering step, this signal comprises a frequency component corresponding to the frequency of the rectangular signal and a low frequency component corresponding to the triangular signal which modulates one of the two limits of the rectangular signal. The filter thus eliminates low frequency components and the signal assumes a symetrical shape, i.e. such that the two limits of the signal are equally modulated.

The invention will be best understood in the light of the following description of one embodiment of the invention, which is given by way of an illustrative and non-limiting example, with reference to the attached drawings in which.

Figure 1:
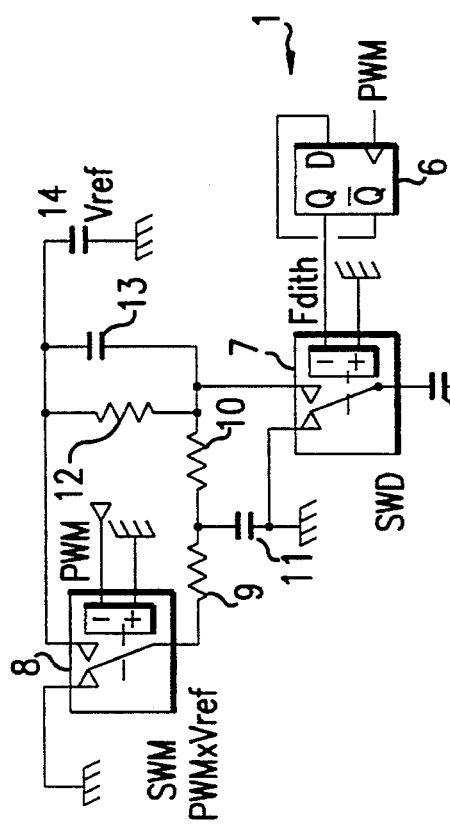
FIG. 1 shows an example of an input circuit for an electricity meter comprising a current measurement circuit as per the present invention.
Figure 1:
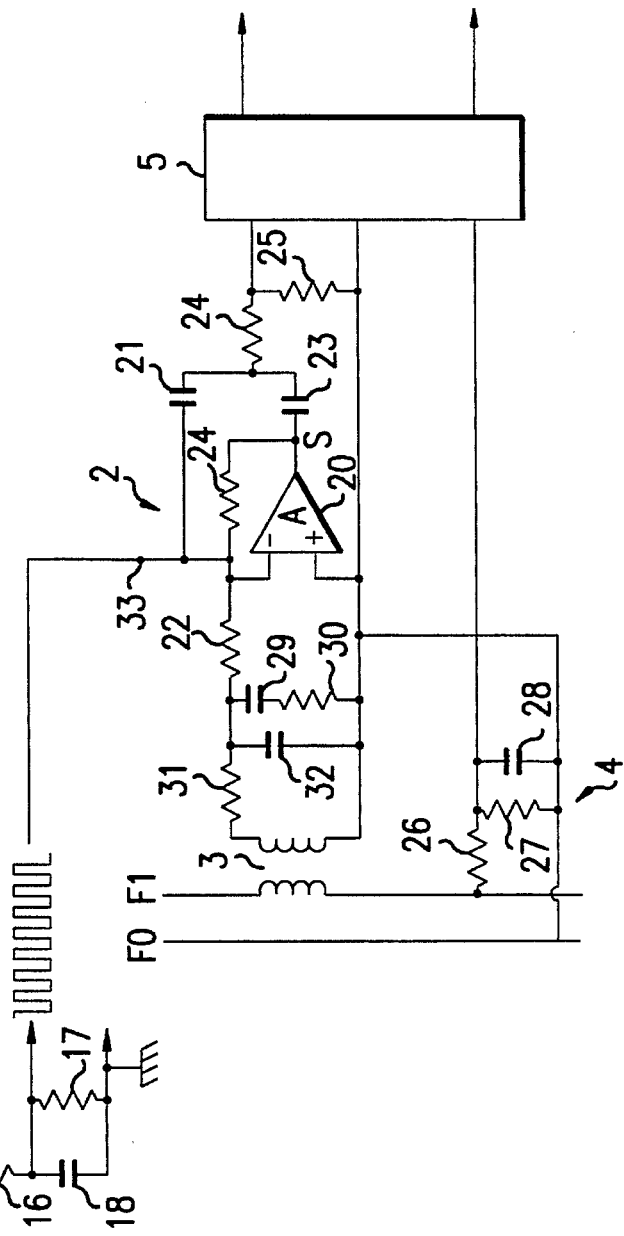

As is shown in FIG. 1, the input circuit for an electricity meter as per this embodiment comprises a current measurement circuit including a dither circuit 1 and an integrating circuit 2, which integrates the signal from an inductance transformer 3 (mutually coupled transformer) combined with a square wave supplied by the dither circuit, a voltage measurement circuit 4 and an analogue to digital converter 5.

The dither circuit 1 comprises a latch 6 which receives the PWM signal of a microprocessor associated with this circuit. The latch divides the average frequency of the PWM signal in order to create a square wave. The modulation signal is produced by the switch 8 which cuts the reference voltage Vref in response to the PWM signal of the microprocessor, so as to produce, after filtering by the resistance and capacitor 9 and 11 and addition of the reference voltage Vref by the resistances 9, 10 and 12, the modulated Vref signal. This signal is modulated in a triangular form at the frequency of the PWM cycle and having a depth of modulation which is dependant on the relation $$\frac{R12}{R9+R10}$$

This signal is then cut by the second switch 7 in response to the square wave produced by the PWM signal passed via the latch 6 so as to provide an assymetrically modulated square wave signal. The capacitor 13 serves to equalise the rise and fall times of the modulation signal.

Figure 2:
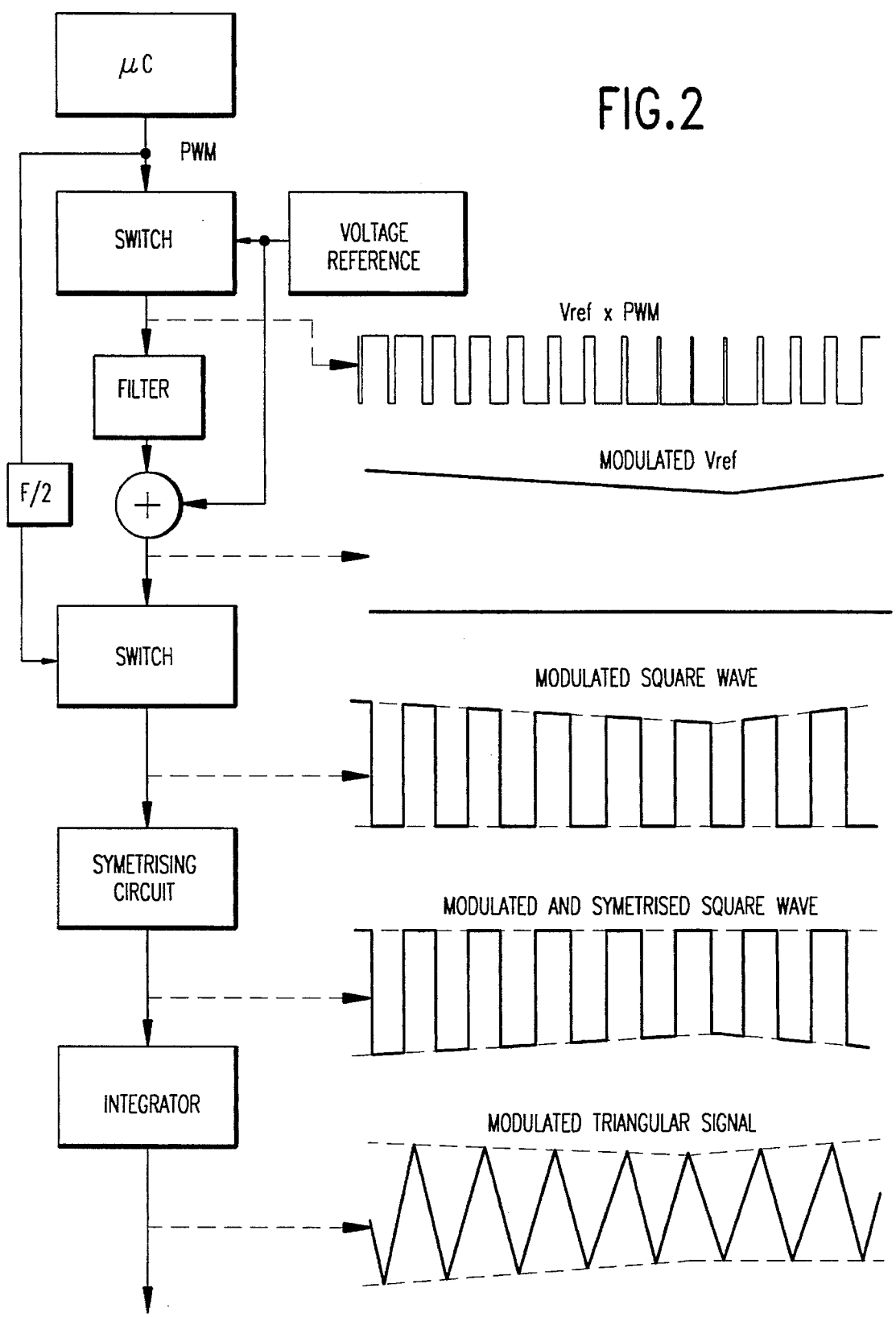
FIG. 2 shows the steps of creation of the dither signal added to the current signal measured by the circuit of FIG. 1.

As shown in FIG. 1, this signal, modulated at its upper limit, is treated by a symetrising circuit comprising a capacitor 15, which eliminates the low frequencies which render the modulated square wave assymetric so as to generate a trapezoidally modulated square wave, and resistances 16, 17 and a capacitor 18 which function to compensate for the distortion of the trapezoidal signal output from the capacitor 15. In effect, the symetrising circuit comprising the components 15 to 18 constitutes a pass band filter, which passes the frequency of the square wave and its first harmonics and which excludes the frequencies which distort the symetrical form of the signal. Referring to FIG. 2 a square wave signal modulated and symetric is thus produced.

As shown in FIG. 1 the current measurement circuit further comprises a mutual inductance transformer 3, the signal of which represents the derivative of the current which passes in the phase F1 of an a.c. network. This signal is supplied to the integrator circuit 2 and after to the analogue-digital converter 5. The integration circuit 2 comprises an amplifier 20 having a feedback loop formed of a capacitor 21 and a resistance 22 which control the integration of the signal of the transformer. The circuit further comprises a coupling capacitor 23 connected at the output of the amplifier upstream of the feedback loop, which changes the characteristics of the circuit in order to suppress low frequencies and dc signals, and a gain limiting resistance 24 which prevents the saturation of the amplifier. A voltage divider 24, 25 is connected at the output of the circuit upstream of the converter 5. In effect, these elements of the circuit correspond to the circuit described in EP 0 403 330 which supplies a signal corresponding to the integral of the signal of the transformer without parasitic effects and distortions of the signal.

The current measurement circuit forms part of an input circuit of an electricity meter which further comprises a voltage measurement circuit 4, comprising a voltage divider comprised of two resistances 26, 27. The input circuit of the present invention is different from that of the circuit of EP 0 403 330 in that there is no phase correcting element in the voltage signal path, the capacitor 28 functioning only to attenuate undesired high frequencies. That is, the phase correction elements are formed by the capacitor 29 and the resistance 30 which function in combination with the resistances 22 and 31 to correct the phase in the current path so that the current and voltage paths are in phase at the input of the analogue to digital converter. The current path further comprises a capacitor 32 which attenuates undesired high frequencies. The capacitors 28 and 32 are optional and may be omitted in other embodiments.

The signal from the dither circuit is added to the signal received from the transformer 3 and supplied to the integration circuit at the point 33. The combination of the signals is then integrated in order to create a signal representing the image of the current measured by the transformer dithered by a dither signal having the form of a triangular waveform modulated by a trapezoid. The amplitude of the waveform and of the modulation signal are chosen to create a dither signal comprising a triangular signal 30 having an amplitude corresponding to several quantisation steps of the converter modulated at each limit by an amplitude corresponding to at least half a quantisation step. The signal is then supplied to the input of the analogue to digital converter. As described in the introduction above, the use of a signal having this form improves the resolution of the signal by the converter. After the step of conversion the dither signal can be removed using a digital decimation filter or other known means, for example, by the conversion of the anlogue dither signal to a digital signal and the subtraction of this signal from the signal representing the combined values of the current and dither signal. The current and voltage signal thus calculated can be used in a calculation of the energy consumed etc.

I claim:

1. Current measurement circuit comprising a mutual inductance transformer and an integration circuit which integrates the signal from the transformer characterised in that the measurement circuit further comprises a dither circuit which adds a substantially rectangular signal to the signal from the transformer before the input of the integration circuit in order that the integration circuit provides a signal representing the measured current perturbed by a substantially triangular dither signal.

2. Current measurement circuit as claimed in claim 1 in which the dither circuit supplies a substantially rectangular signal modulated by a modulation signal.

3. Current measurement circuit as claimed in claim 1 in which the substantially rectangular signal is generated by switching means comprising at least one latch which receives a pulse width modulated signal and which divides the frequency of this signal in order to create a substantially rectangular signal.

4. Current measurement circuit as claimed in claim 3 in which the dither circuit comprises an integrator which integrates the pulse width modulated signal in order to create a triangular signal representing one limit of the modulation signal, this signal being supplied to switching means in order to create a signal substantially rectangular having only one limit which varies as per the signal from the integrator, the dither circuit further comprising a filter which filters low frequency components so as to provide a rectangular signal which is symetrically modulated.

5. Current measurement circuit according to claim 4, the integration circuit comprising an amplifier having a gain limiting resistance and a feedback loop, including a feedback capacitor, the integration circuit further comprising a second capacitor connected at the output of the amplifier upstream of the feedback loop.

6. Current measurement circuit according to claim 5 further comprising means for correcting the phase between the integrated signal and the signal received from the transformer and comprising a passive filter connected upstream of the amplifier.

7. Input circuit for an electricity meter comprising a voltage measurement circuit and a current measurement circuit according to claim 6, the passive filter of the current measurement circuit compensating for the phase differences between the current and voltage paths so that the voltage measurement circuit can measure the voltage in the network without changing its phase and without phase compensation elements.

* * * * *